United States Patent
Jacobsen et al.

(10) Patent No.: US 6,664,778 B2
(45) Date of Patent: Dec. 16, 2003

(54) CIRCUIT BOARD COUPON TESTER

(75) Inventors: Chris R Jacobsen, Astoria, NY (US); John E Siefers, Ft Collins, CO (US); Dwight Fowler, Loveland, CO (US); Shion Chen Hung, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 149 days.

(21) Appl. No.: 09/862,364

(22) Filed: May 22, 2001

(65) Prior Publication Data

US 2002/0175672 A1 Nov. 28, 2002

(51) Int. Cl.$^7$ ............................................... G01R 31/00
(52) U.S. Cl. ..................... 324/158.1; 324/761
(58) Field of Search ............................. 324/158.1, 73.1, 324/754, 762, 761, 500, 537, 719, 766

(56) References Cited

U.S. PATENT DOCUMENTS

| | | | | |
|---|---|---|---|---|
| 4,510,446 A | * | 4/1985 | Braun et al. | 324/766 |
| 4,894,606 A | * | 1/1990 | Paur | 324/73.1 |
| 5,451,885 A | * | 9/1995 | Birch et al. | 324/760 |
| 6,326,797 B2 | * | 12/2001 | Caggiano et al. | 324/719 |

* cited by examiner

*Primary Examiner*—Vinh P. Nguyen (57) ABSTRACT

A circuit board coupon testing method and apparatus. A coupon tester uses a linear actuator to carry a test head and probe(s) for an LCR meter. The linear actuator accurately steps the probe(s) over a coupon of components arranged linearly adjacent an edge of the circuit board to measure the parameters of the component. The coupon tester can be integrated with an in-circuit tester to provide further functionality, with the coupon test being carried out simultaneously with a portion of the in-circuit test such as an unpowered portion of the in-circuit test.

20 Claims, 5 Drawing Sheets

CIRCUIT BOARD COUPON TESTER

FIELD OF THE INVENTION

This invention relates generally to the field of testing electronic circuit boards. More particularly, this invention relates to a method and apparatus especially useful for coupon testing low value components on electronic circuit boards.

BACKGROUND OF THE INVENTION

Testing high frequency, low value components on a printed circuit board presents many challenges. In the production of circuit boards for radio frequency (RF) and very high speed data applications, manufacturers must often use very small value components that match the frequency requirements of the board design. Since small value parts (e.g., 1 pF capacitors, 10 nH inductors) are generally too physically small to include any visible markings, it is very difficult to determine if a wrong reel was placed into the pick-and-place machine. As a result, a whole production run of boards may be populated with the wrong part, forcing costly repairs and creating significant time-to-market problems.

In-Circuit Testing (ICT) is the traditional mechanism to test component values in order to find such a wrong part. ICT equipment is commercially available from a number of manufacturers such as the Agilent 3070 from Agilent Technologies, 395 Page Mill Road, Palo Alto, Calif. 94306, the GenRad TestStation from GenRad, Inc., 7 Technology Park Drive, Westford, Mass. 01886, and the Teradyne Spectrum from Teradyne, Inc., 321 Harrison Avenue, Boston, Mass. 02118. Current ICT equipment very capably handles standard analog components (capacitors>10 pF; inductors>25 uH) loaded on a printed circuit board, and in isolation can often measure even lower value capacitors with adequate accuracy. However, due to the level of impedance and noise between the signal generator, the probes and the board, smaller component values often cannot be accurately measured. Furthermore, the multiplexing of multiple probes to a single input to the ICT equipment to make measurements can add significant errors to the measurement capabilities on small value inductors and capacitors due to the variation in distance to the ICT instrument and the unloaded impedance at each probe. Even if these components are placed on a "coupon" outside of the circuit, current ICT equipment has difficulty measuring such components with accuracy. Specifically, inductors smaller than about 25 uH are generally not testable. Furthermore, though ICT equipment can measure capacitors between 1 pF and 10 pF, the measurement can be noisy and inconsistent.

Another type of test device uses so-called "flying probes" that use a set of moveable probes that move in the X and Y directions across a printed circuit board to take measurements at any given location on the circuit board. Such devices are currently available commercially, for example, as the Teradyne Javelin, and the GenRad GR Pilot. Currently, the use of flying probers is mainly restricted to prototyping since they are too slow for high speed, high volume manufacturing applications. Moreover, the cost of accurate X-Y registration is comparatively high and the accuracy limited as a tradeoff for the ability to probe any point on the circuit board. Currently, the measurement accuracy of flying probers is comparable to standard ICT measurements. Thus, the measurement accuracy is often insufficient for high frequency, low value components.

With standard analog components, Manual Visual Inspection (MVI) is often a viable way to verify that a correct component has been loaded on the board. Such visual inspection can often quickly detect when an incorrect part has been loaded due to, for example, incorrect loading of a reel of parts on an automated component insertion machine. Unfortunately, small value components such as those commonly used in Radio Frequency (RF) circuits are generally so physically small that they are not labeled in any manner whatsoever. Therefore, a 5 pF capacitor looks exactly like a 1 pF capacitor, and visual inspection often cannot detect an erroneous component placement.

Automated optical inspection (AOI) equipment, such as the Agilent BV3000, Teradyne Optima 7300 and CR Technology RTI6520 from CR Technology, Inc., a subsidiary of Photon Dynamics, Inc., 6325 San Ignacio, San Jose, Calif. 95119 suffer from the same limitations as MVI. Since RF components are often not marked, these machines cannot determine that wrong parts have been installed.

Reel testers, such as those found in auto insert machines, can verify that the proper reel is loaded by scanning the manufacturer's barcode on the reel. In the past, there have also been other reel testers which visually inspect the components or verify the component values on the reel. The barcode scanning reel tester scans the barcode placed on the reel from the part manufacturer. This method does not actually verify the values of the components, only the labeling of the reel. If the reel is mislabeled, (a situation that has occurred in the past) thousands of erroneous parts may be installed before the problem is detected.

Visual inspection using a reel tester is not useful for components that cannot be uniquely visually distinguished from other components.

Electrical measurement reel testers were available for axial lead components, where the device could drag probes over component leads to measure. It is not believed that this type of reel tester has been adapted to use with surface mount (SMT) components. The electrical measurement reel tester also has some limitations. First, its measurement accuracy may not be sufficient to accurately test small value inductors and capacitors. Second, a reel tester does not test whether the actual parts loaded onto the system are in the correct location. A programming error on the reel tester could easily translate to mis-loaded parts placed on the boards.

Automated x-ray inspection (AXI) equipment such as the Agilent 5DX, GenRad MV-6100 and CR Technology AXI are designed primarily to find solder defects. An AXI machine cannot measure any component values whatsoever. As a defect solder analysis machine, it adds no value in testing RF inductors and capacitors. However, it may be able to read some part markings and find some orientation faults in polarized capacitors.

Functional testers generally perform tests that simulate the function of a particular circuit implemented on the circuit board. Often, functional testers would be able to catch a mis-loaded part placement on a board, provided the functional test was exhaustive enough to find a particular error. However, due to the time required to perform exhaustive functional tests, thousands of boards could have been mis-loaded before a problem is detected. The expense in repairing these boards is prohibitively high. Moreover, certain circuit components (e.g., bypass capacitors) could be incorrect without being detected by most functional testers. Other component errors could make a circuit's performance marginal without outright failure in a functional test environment but lead to failures in the field. Additionally, exhaustive testing may be prohibitively complex and time consuming in highly complex circuits, resulting in use of a less than completely exhaustive functional test program that might not identify an erroneous part.

Accordingly, there is currently no known acceptable way to reliably test for assembly errors in circuit boards carrying small valued parts.

BRIEF SUMMARY OF THE INVENTION

The present invention relates generally to coupon test method and apparatus. Objects, advantages and features of the invention will become apparent to those skilled in the art upon consideration of the following detailed description of the invention.

In one embodiment consistent with the present invention, a circuit board coupon testing method and apparatus is provided in which a coupon tester uses a linear actuator to carry a test head (a test fixture) and probes for an LCR meter. The linear actuator accurately steps the probes over a coupon of components arranged linearly (preferably) adjacent an edge of the circuit board to measure the parameters of the component. The coupon tester can be integrated with an in-circuit tester to provide further functionality, with the coupon test being carried out simultaneously with a portion of the in-circuit test such as an unpowered portion of the in-circuit test.

A circuit board coupon tester for testing a coupon forming a part of a circuit board consistent with an embodiment of the present invention includes a test fixture for holding the circuit board in a prescribed position. A probe head has a probe for probing a coupon component terminal that forms a part of the circuit board coupon. A linear actuator is connected to the probe head. An LCR meter is electrically coupled to the probe head. A test controller operates under program control to carry out a coupon test by: causing the linear actuator to move the probe head in a linear direction to a desired position; causing the probe to engage the coupon component terminal; and receiving a value associated with the coupon component from the LCR meter.

A circuit board coupon tester, consistent with another embodiment, for testing a coupon forming a part of a circuit board, has a test fixture for holding the circuit board in a prescribed position. A probe head with a probe is used for probing a plurality of coupon component terminals forming a part of the circuit board coupon. A linear actuator is connected to the probe head. An LCR meter is electrically coupled to the probe head. A test controller operates under program control to carry out a coupon test by: causing the linear actuator to move the probe head in a linear direction to a desired position over each component of the coupon; causing the probe to engage each of the plurality of coupon component terminals; and receiving a value associated with each of the plurality of coupon components from the LCR meter.

In another embodiment consistent with the present invention, a method of testing a circuit board, the circuit board having a coupon thereon, the coupon having a plurality of components with a plurality of test pads coupled to each of the plurality of components, the coupon components being arranged linearly adjacent an edge of the circuit board includes holding the circuit board in a fixture in a prescribed position, the fixture having a linear actuator thereon carrying a test head with a probe; under program control, sequentially moving the test head linearly to a position above each of the plurality components; engaging the probe with the test pads for each of the plurality of components; and measuring a value associated with each of the plurality of components.

Another method of testing a circuit board, consistent with certain embodiments of the invention includes providing a circuit board fixture holding the circuit board in a prescribed position; conducting a coupon test on the circuit board; conducting an in-circuit test on the circuit board; and wherein at least a portion of the coupon test is conducted simultaneously with at least a portion of the in-circuit test.

A circuit board panel consistent with certain embodiments of the invention includes at least one circuit board that carries out an electronic function. A test coupon region is preferably situated adjacent an edge of the circuit board panel with a plurality of components, each having a coupon component terminal, arranged linearly along the coupon region. Each of the coupon components have a test pad electrically coupled with the coupon component terminal, wherein the coupon components are arranged along a line approximately parallel with the edge of the circuit board panel and spaced at regular intervals, and wherein at least one of the coupon components is selected from a group consisting of a capacitor having value less than or equal to 10 pf and an inductor having value less than or equal to 25 microHenrys, i.e., small value RF components.

Many variations, equivalents and permutations of these illustrative exemplary embodiments of the invention will occur to those skilled in the art upon consideration of the description that follows. The particular examples above should not be considered to define the scope of the invention.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Figure 1:
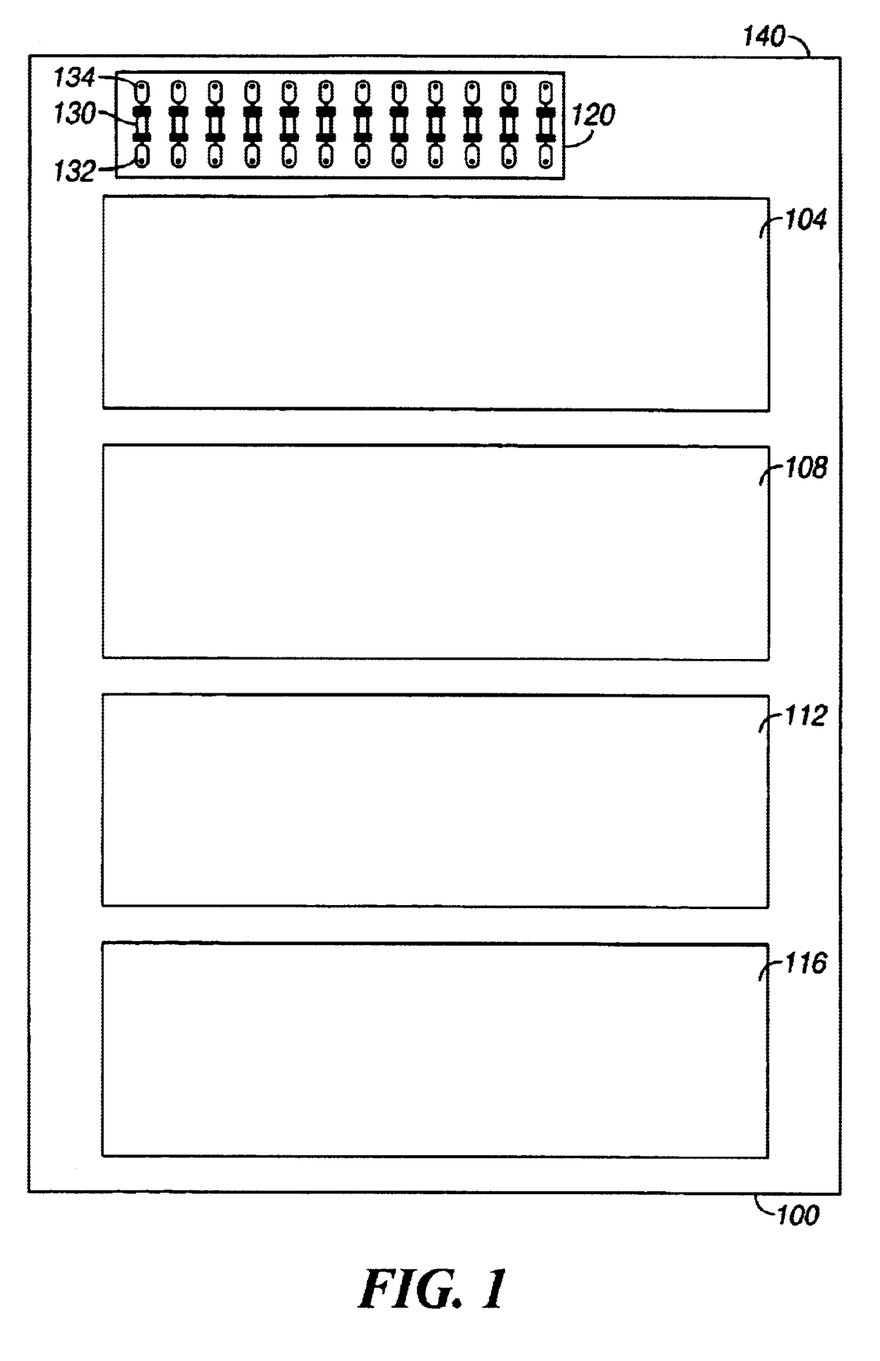
FIG. 1 is a circuit board panel having a coupon consistent with an embodiment of the present invention.

Turning now to FIG. 1, a circuit board panel 100 is illustrated carrying four printed circuit boards 104, 108, 112 and 116. These printed circuit boards are generally multiple instances of the same circuit manufactured as a panel of circuit boards for manufacturing efficiency. The circuit boards 104, 108, 112 and 116 are separated by cutting or breaking after manufacturing and test to provide separate products. Of course, more than or fewer than four such boards may be provided on a single panel 100. A panel 100 may equivalently have only a single circuit board without departing from the invention.

A coupon 120 is provided on the panel 100. The coupon 120 has a set of components such as 130 that are soldered to solder pads such as 132 and 134 and which are electrically isolated from the functional portion of any of the circuit boards in panel 100 and serve as test pads. Coupons are commonly known and used in circuit board testing. The coupon was originally conceived as a process check for manufacturing steps, enabling access to parts that otherwise could not be tested. When such coupons are used, the designer generally has a significant amount of latitude in deciding what goes into the coupon and where it is physically placed on the panel.

By testing the values of the components residing on the coupon 120, it can be confirmed that the correct part values were loaded onto the coupon. Since the components placed on the coupon are used in the actual board, if the coupon components are placed in the correct order, the components on the board are also placed in the proper location. Thus, a determination can be made that the correct reels are loaded onto a pick and place machine and that the boards on the panel have been correctly assembled.

In accordance with embodiments of the present invention, this coupon 120 is arranged in a linear array adjacent an edge 140 of the circuit board panel 100 in a manner similar to that shown, with the component's terminals aligned perpendicular to the edge 140. Preferably, the components such as 130 are arranged at equal spacing along a linear path (e.g., at a spacing of 0.083 inches center to center).

Figure 2:
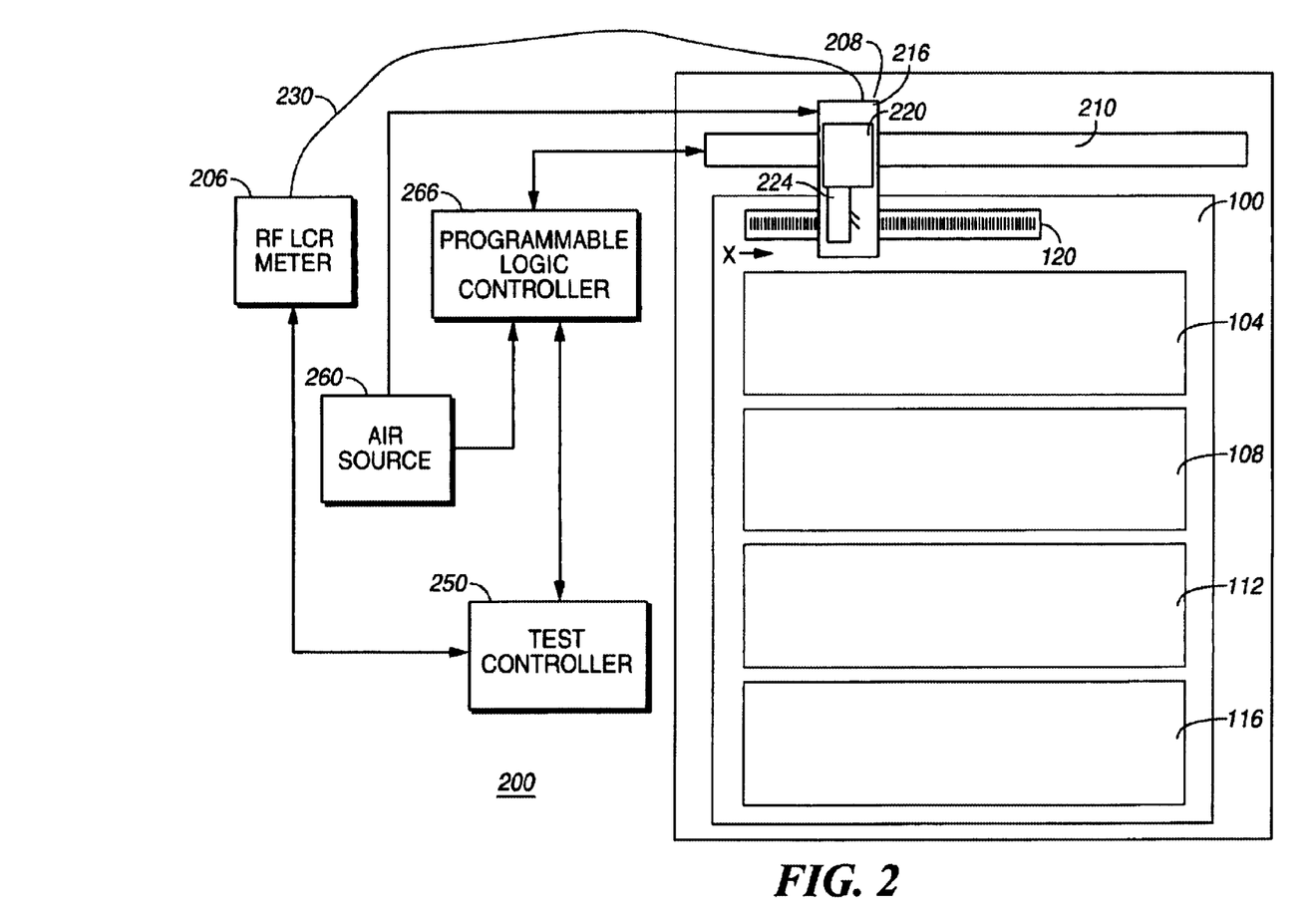
FIG. 2 is a top view of a coupon tester consistent with an embodiment of the present invention.
Figure 5:
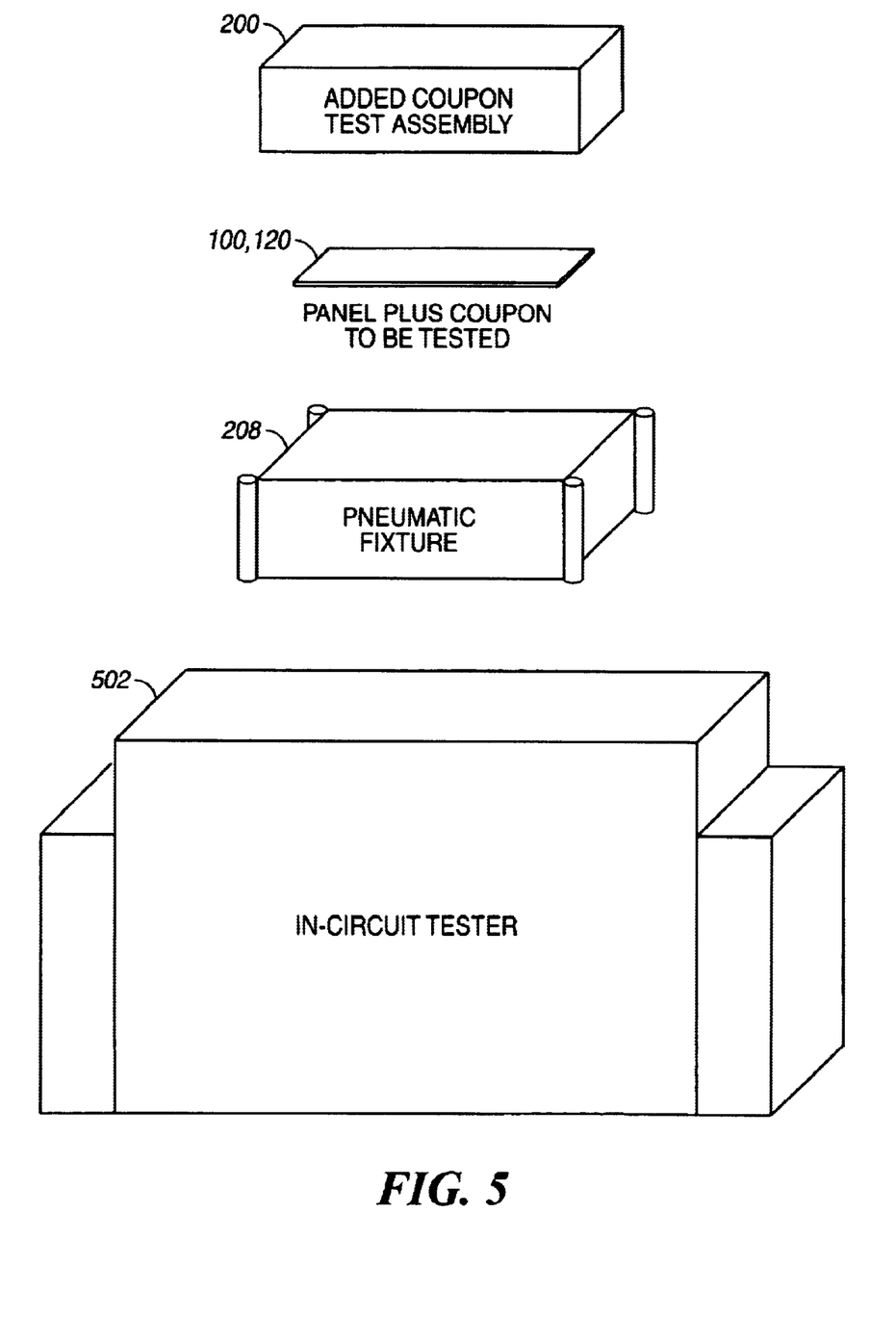
FIG. 5 is a block diagram exemplary of in-circuit testing, in accordance with embodiments of the present invention.

Referring now to FIG. 2, an embodiment of the coupon tester 200 of the present invention is illustrated. In accordance with the embodiment illustrated, the coupon 120 tested with a fast high-accuracy computer controllable LCR meter 206 (such as the commercially available Agilent 4287A LCR meter) and a scaleable, motion-controlled probing mechanism mounted on the top plate of a pneumatic fixture 208. The pneumatic fixture 208 preferably doubles as a highly accurate reference platform, adapting the panel 100 to an ICT machine. Such an ICT machine usually probes the circuit boards in panel 100 from below to conduct an in-circuit test. The motion-controlled probing mechanism of the coupon tester 200 sits atop the ICT machine (e.g., the Agilent 3070 series) with the entire coupon test preferably occurring in parallel with standard in-circuit testing and sharing the pneumatic fixture 208 to hold the panel 100 in place in a desired orientation. An exemplary illustration of such a configuration 500 with an ICT machine is shown in FIG. 5. in which an ICT machine 502 is used to test circuit boards of a panel 100 plus a coupon to be tested 120, part of coupon tester 200. As shown, the coupon tester 200, with panel and coupon 100, 120, is held in place by fixture 208 for testing by ICT machine 502.

The motion controlled probing mechanism has a linear actuator including a fixed track 210 that carries a moving carriage 216 along a linear path in the X direction (in the illustrated embodiment). The carriage 216 may be driven, for example, by a servo motor or a stepping motor. The moving carriage 216 carries a removable test head 220 with a probe assembly 224. The probe assembly is preferably situated in a fixed mechanical relationship with the test head (which forms a remote input to the LCR meter 206. In the preferred Agilent 4287A LCR meter, the test head 220 is provided as a standard part of the LCR meter and is connected thereto by a flexible cable 230. The RF LCR meter 206 is preferably kept a short distance from the linear actuator to minimize cable length of cable 230 and limit the movement of the cable during the test process. In the present embodiment, a three meter long cable is used to permit adequate movement of the test head 220 and probe assembly 224. The probe assembly 224 has one or more probes (e.g., spring loaded probes) that are engaged with test pads 132 and 134, preferably at vias. The probes engage the test pads by movement of the probe head in the Z direction (toward the panel 100).

Under control of the test controller 250, that is also connected to the RF LCR meter 206, the carriage 216 of the linear actuator is sequentially stepped along the X direction (in this embodiment) to access each of the coupon 120's components with the probes of probe assembly 224. At a location associated with each component, the probe assembly is pivoted toward the panel 100 to engage the probes with the solder pads in order to take a test measurement of the component connected between the pads. The probe can be pivoted or stroked into and out of engagement with the pads using an electrically controlled solenoid in one embodiment, but could also be accomplished by a pneumatic piston-cylinder arrangement powered by air source 260 (or a combination thereof) under control of test controller 250. A linear movement in the Z direction or a pivoting movement of the probes in the Z direction or other movement can be implemented to effect engagement of the probes with the solder pads without departing from the invention.

A programmable logic controller (PLC) 266, specifically designed to control actuation, test head movement and Z movement to engage the probes with the coupon, may be a separate computer or may be a part of the ICT system. In pneumatic embodiments, PLC 266 is coupled to the air source 260. PLC 266 is preferably programmed to begin at one end of the coupon 120 and incrementally step the carriage carrying the test head toward the other end. The carriage 216 stops at each component location under program control from test controller 250, moves the probes into engagement with the component's test pads. The PLC 266 then prompts the ICT controller 250 that it is ready, and waits for the ICT controller to allow the LCR meter to measure the component. Once the LCR meter makes the measurement, the ICT controller 250 stores the component value and signals the PLC 266 to go to the next component. The PLC 266 moves the probes to a position safely above the coupon components and proceeds to the next component. The motion-controlled mechanical probe of the present invention is thus moved across the coupon to probe the components thereof. The probe arrangement of the present invention differs from a so called "flying prober" that is generally designed to traverse the entire circuit board or panel to any location in the X and Y direction. The probe mechanism of the present invention utilizes a precise stepping mechanism that can only move in the X-direction (or other linear direction) and probes by pivoting or otherwise moving the probes in the Z-axis. This provides several distinct advantages over true "flying probes" and other test arrangements.

The present invention can be readily scaled to any appropriate number of components in the coupon. The incremental cost to add another component into the coupon test is minimal in comparison to electrically switching (multiplexing) coupon component tests using an ICT. A coupon of up to 18" long can be tested using a single linear actuator and probe assembly using the preferred Agilent 3070 integrated with the coupon testing arrangement described and a three meter flexible cable. Multiple assemblies can be used to provide for testing a larger number of components. The step accuracy can be maintained within satisfactory limits even with the system being designed using predominantly low cost off the shelf components.

The mechanical probe of the present invention can readily make high precision regularly spaced steps to move from component and ensure measurement consistency. Measurement precision is enhanced over that of multiple probes using multiplexing as in a conventional ICT device. The switching (e.g., as needed for multiplexing multiple probes) induces errors in measurement compensation. Using a single set of probes to make all measurements removes a significant number of variables and uncertainties. Moreover, the coupon test of the present invention can be implemented in parallel with and independent of ICT testing.

In order to protect the operator and to assure no operator interference in movement of the LCR test head, it is desirable that steps be taken to isolate the coupon tester from test operator. This can be accomplished using standard interlock techniques and covers.

In order to standardize all panels used for a particular coupon test arrangement, a fixed coupon X-Y location preferably adjacent an edge of panel 100 is defined for use on all panels. Preferably, a fixed distance should be defined between components (e.g., 0.083" center to center) in order to standardize the linear actuator on all coupon testers. Fixed width between component testpoints should also be defined in order to standardize the probes. To improve probe travel consistency, component testpoints should be situated at vias. Of course, these standardization techniques should not be considered limiting to the invention as broadly described herein. While it is preferred that the coupon be situated adjacent an edge of the panel 100, this should not be considered limiting since the linear actuator can be positioned in other locations to accommodate a coupon placed, for example, in the middle of a circuit board panel. In such cases, the linear actuator assembly with test head and probes can, if need be, straddle the circuit board panel and be fixed in place above the circuit board panel without departing from the invention.

Figure 3:
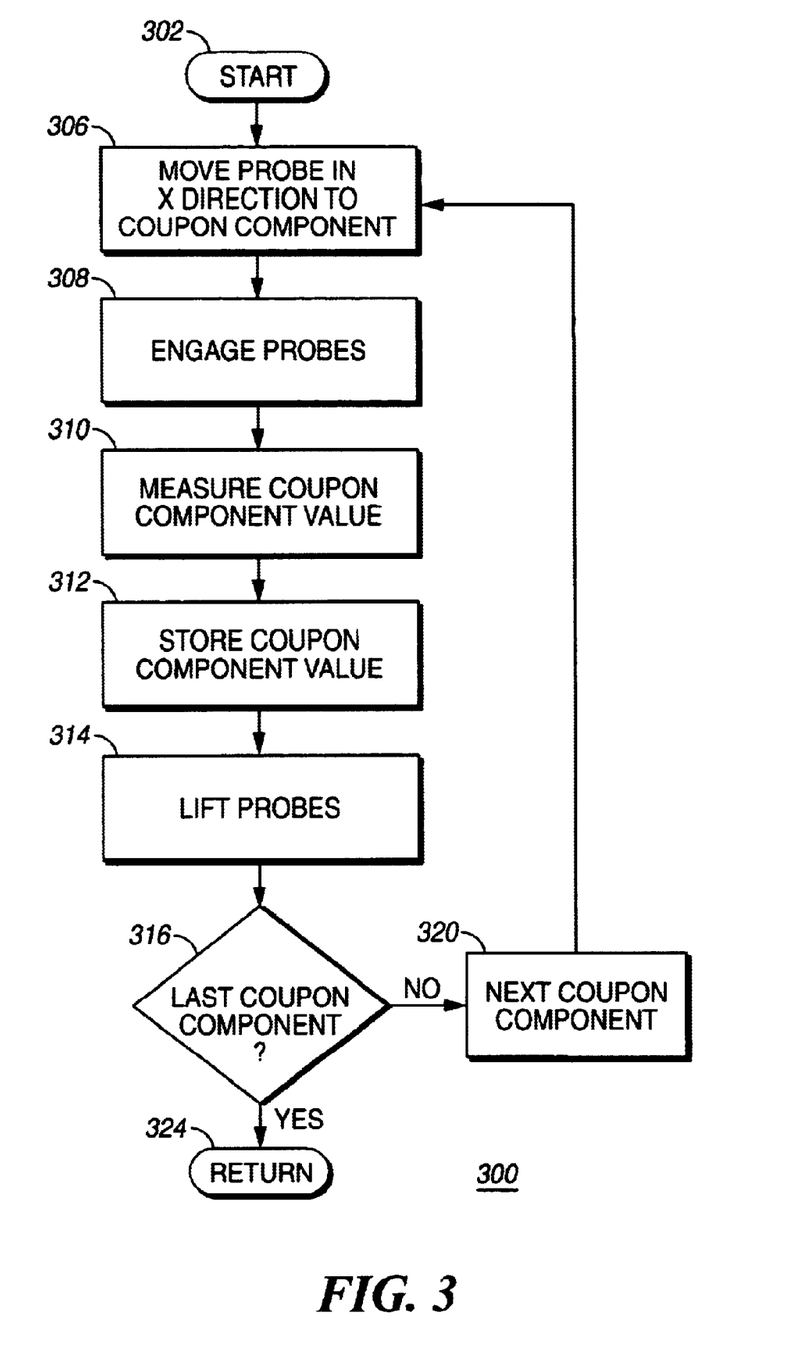
FIG. 3 is a flow chart illustrating a coupon test process consistent with an embodiment of the invention.

The process followed during a coupon test according to an embodiment of the present invention is illustrated in FIG. 3 as process 300 starting at 302. At 306, the probe is moved along the X direction (or other linear direction) by the linear actuator under program control to a first coupon component. The probes are engaged with the component's test pads at 308 and the coupon component is measured at 310. The coupon component's measured value is stored by the test controller at 312 and the probes are lifted at 314. If this coupon component is not the last component, control then passes to 306 where the linear actuator moves the test head and probe assembly along the X direction to the location of the next component and the process repeats. Once the final component has been measured as determined at 316, the process returns at 324 to await loading of the next panel 100.

Those skilled in the art can appreciate that the above process can be modified in many ways without departing from the invention. For example, the components can be engaged and measured sequentially from left to right or right to left or in another specified order (e.g., largest value to smallest, all capacitors as a group, all resistors as a group, all inductors as a group, multiple frequency tests with common frequency measurement occurring as a group). Additionally, although the process 300 stores the component value at 314 after each measurement, the component values can be cached and stored as a group after the entire coupon is tested. In other embodiments, the process can terminate upon identification of a failure without proceeding to test all coupon components. Other variations will occur to those skilled in the art.

Figure 4:
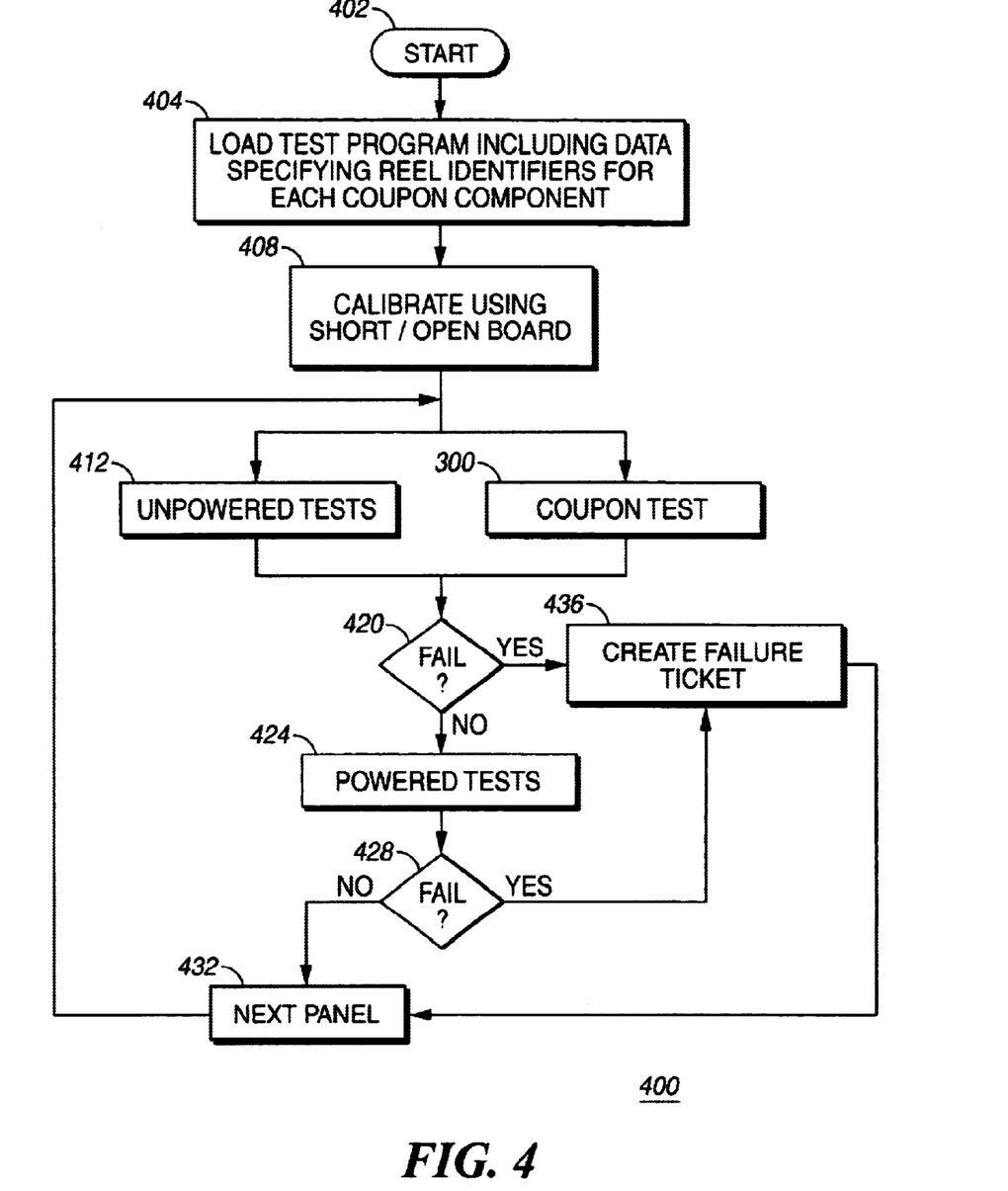
FIG. 4 is a flow chart illustrating a coupon test process integrated with an in-circuit test consistent with an embodiment of the present invention.

According to certain embodiments of the invention, the coupon test just described can be carried out in parallel with other in-circuit testing with the coupon tester being integrated with a conventional in-circuit test device. FIG. 4 illustrates one such process as process 400 starting with 402. At 404, a test program is loaded or booted into a test controller. The in-circuit tester and the coupon tester are then calibrated using a calibration panel containing, for example shorts and opens or other known conditions. At 412, a series of unpowered tests is conducted (i.e., tests in which there is no supply voltage applied to the panel 100. Simultaneously, the coupon test 300 is conducted. Since these tests do not interfere with one another, they can be carried out simultaneously so that the coupon test adds no significant time penalty to the overall testing of the panel 100.

If no failure is encountered at 420, powered tests (tests with supply voltage applied) are carried out at 424. If no failures are encountered at 428, the next panel can be loaded at 432 and the process can be carried out again starting with 412 and 300 (assuming a recalibration is not needed after each panel is tested). If a failure occurs at 420, a failure ticket is created and the process can be stopped before potentially destructive supply voltages are added for powered tests at 424. The failure ticket will generally tell the operator the nature of the failure and may point to a defective component or potentially incorrectly loaded component reel. In a similar manner, failure at 428 leads to generation of a failure ticket at 436.

Embodiments of the coupon tester consistent with the present invention can act as a standalone tester. However, certain embodiments can also be implemented as a component in other testers. Preferably, the present invention is integrated with an in-circuit tester. The ICT test controller controls the mechanical movement and the testing of the coupon tester. It also gathers the data and determines a pass/fail state. In this form, it augments the ability of the ICT to find misloaded RF components. A coupon test can occur at the same time as a portion of the in-circuit test (preferably, the unpowered portion). Thus, no additional time is spent testing for misloaded parts.

The coupon tester can also be integrated with an AXI test strategy, wherein the coupon tester cooperates with the AXI machine to test for orientation and correct parts. For boards without enough in-circuit nodal access, this combination of AXI and coupon testing may provide the best test coverage. ICT may not be needed on those board types.

Since the coupon test can be performed immediately after all parts have been soldered to the panel, misload errors can be found almost immediately. With the current coupon tester/ICT combined implementation, the ICT can notify the operator if a misloaded part is identified on the coupon via the failure ticket. Production can be halted immediately to correct the problem and minimize the number of boards built incorrectly.

The coupon testing arrangement of the present invention provides a very high level of measurement accuracy. In addition to the high-performance LCR meter, the mechanical probing arrangement is designed for simplicity and precision. The probe sits on top of a linear actuator, which moves the probe precisely in the X direction (in regularly spaced steps in the preferred embodiment). This level of measurement accuracy is crucial when working with RF components. Even a small error in distance can throw measurements off significantly, making more complex movement, as in true "flying probes" unsuitable for obtaining the required accuracy for small value RF parts (e.g., <about 10 pf capacitors and <about 25 uH inductors). Furthermore, certain probe styles require perpendicular motion to reliably contact the board. Flying probers generally do not guarantee perpendicular motion, reducing their effectiveness in RF testing even further.

Unlike a reel tester, the coupon tester of the present invention tests parts on the board. This represents a significant improvement, since it guarantees that the actual parts are measured and checked for the correct placement. A reel tester, if fed the wrong information, would never fail a misloaded reel.

Instead of using many sets of immobile probes and a multiplexing array, as is common with ICT, the present invention uses a single set of mobile probes for all measurements. This removes the need for expensive high accuracy multiplexing of measurement signals.

For the present invention to accurately measure at high RF frequencies, the phase due to time delay down the transmission line should be removed while retaining the phase that results from the component being measured. The process of calibration removes (among other errors) this phase delay. A multiplexed test methodology would require a calibration at each probing location, since the line length varies from location to location. Since only one set of probes is used, the physical line length never varies (although minor changes in the electrical equivalent line length might occur), so calibration only needs to be done once. This saves time while maintaining high measurement accuracy.

Thus, the present invention combines the speed of ICT with a high accuracy mobile coupon tester. The invention also uses a much simpler mechanism at a much lower cost.

The present invention is preferably implemented using a programmed processor executing programming instructions that are broadly described above in flow chart form and which can be stored in any suitable electronic storage medium. However, those skilled in the art will appreciate that the processes described above can be implemented in any number of variations and in many suitable programming languages without departing from the present invention. For example, the order of certain operations carried out can often be varied, and additional operations can be added without departing from the invention. Error trapping can be added and/or enhanced and variations can be made in user interface and information presentation without departing from the present invention. Such variations are contemplated and considered equivalent.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A circuit board coupon tester for testing a coupon forming a part of a circuit board, comprising:
a test fixture for holding the circuit board in a prescribed position;
a probe head with a probe for probing a coupon component terminal forming a part of the coupon;
a linear actuator connected to the probe head;
an LCR meter electrically coupled to the probe head;
a test controller operating under program control to carry out a coupon test by:
causing the linear actuator to move the probe head in a linear direction to a desired position;
causing the probe to engage the coupon component terminal; and
receiving a value associated with the coupon component from the LCR meter.

2. The apparatus according to claim 1, further comprising an in-circuit tester and wherein the test fixture holds the circuit board in the prescribed position for testing by the in-circuit tester.

3. The apparatus according to claim 2, wherein the test controller further controls the in-circuit tester.

4. The apparatus according to claim 3, wherein the test controller controls the in-circuit tester to conduct an in-circuit test while carrying out the coupon test.

5. The apparatus according to claim 1, wherein the LCR meter comprises a radio frequency LCR meter.

6. The apparatus according to claim 1, wherein the coupon test further comprises storing the component value.

7. The apparatus according to claim 1, further comprising a programmable logic controller, and wherein causing the linear actuator to move and causing the probe to engage are carried out by the test controller instructing the programmable logic controller to cause the linear actuator to move and cause the probe to engage.

8. The apparatus according to claim 1, wherein causing the linear actuator to move and causing the probe to engage is carried out by a processor instructing a programmable logic controller to cause the linear actuator to move and cause the probe to engage.

9. A circuit board coupon tester for testing a coupon forming a part of a circuit board, comprising:
a test fixture for holding the circuit board in a prescribed position;
a probe head with a probe for probing a coupon component terminal of a plurality of coupon component terminals forming a part of the coupon;
a linear actuator connected to the probe head;
an LCR meter electrically coupled to the probe head;
a test controller operating under program control to carry out a coupon test by:
causing the linear actuator to move the probe head in a linear direction to a desired position over each component of the coupon;
causing the probe to engage each of the plurality of coupon component terminals; and
receiving a value associated with each of the plurality of coupon components from the LCR meter.

10. The apparatus according to claim 9, further comprising an in-circuit tester and wherein the test fixture holds the circuit board in the prescribed position for testing by the in-circuit tester.

11. The apparatus according to claim 10, wherein the test controller further controls the in-circuit tester.

12. The apparatus according to claim 11, wherein the test controller controls the in-circuit tester to conduct an in-circuit test while carrying out the coupon test.

13. The apparatus according to claim 9, wherein the LCR meter comprises a radio frequency LCR meter.

14. The apparatus according to claim 9, wherein the coupon test further comprises storing the component value.

15. The apparatus according to claim 9, further comprising a programmable logic controller, and wherein causing the linear actuator to move and causing the probe to engage are carried out by the test controller instructing the programmable logic controller to cause the linear actuator to move and cause the probe to engage.

16. A circuit board coupon tester for testing a circuit board, the circuit board having a coupon forming a part thereof, comprising:
   a test fixture for holding the circuit board in a prescribed position;
   a probe head with a probe for probing a plurality of coupon component terminals forming a part of the circuit board coupon;
   a linear actuator connected to the probe head;
   an LCR meter;
   a flexible cable connecting the probe head to LCR meter;
   an in-circuit tester;
   a test controller operating under program control to carry out a coupon test by:
      causing the linear actuator to move the probe head in a linear direction to a desired position over each component of the coupon;
      causing the probe to engage each of the plurality of coupon component terminals; and
      receiving a value associated with each of the plurality of coupon components from the LCR meter; and
   the test controller further operating to conduct an in-circuit test, wherein at least a portion of the in-circuit test and the coupon test occur simultaneously.

17. The apparatus according to claim 16 wherein the LCR meter comprises a radio frequency LCR meter.

18. The apparatus according to claim 16, wherein the conducting an in-circuit test comprises conducing an unpowered test followed by conducting a powered test.

19. The apparatus according to claim 18, wherein at least a portion of the coupon test is carried out simultaneously with at least a portion of the unpowered test.

20. The apparatus according to claim 16, further comprising a programmable logic controller, and wherein causing the linear actuator to move and causing the probe to engage is carried out by the test controller instructing the programmable logic controller to cause the linear actuator to move and cause the probe to engage.

* * * * *